US012660567B2

(12) United States Patent
Huang et al.

(10) Patent No.: US 12,660,567 B2
(45) Date of Patent: Jun. 16, 2026

(54) SUBSTRATE SUPPORTS FOR SEMICONDUCTOR PROCESSING SYSTEMS

(71) Applicant: ASM IP Holding, B.V., Almere (NL)

(72) Inventors: Shujin Huang, Phoenix, AZ (US);
Junwei Su, Chandler, AZ (US);
Wentao Wang, Chandler, AZ (US);
Zhizhong Chen, Tempe, AZ (US);
Xing Lin, Chandler, AZ (US); Jiwen Xiang, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 728 days.

(21) Appl. No.: 18/048,099

(22) Filed: Oct. 20, 2022

(65) Prior Publication Data

US 2023/0128390 A1 Apr. 27, 2023

Related U.S. Application Data

(60) Provisional application No. 63/270,380, filed on Oct. 21, 2021.

(51) Int. Cl.
*H10P 72/76* (2026.01)

(52) U.S. Cl.
CPC ...... *H10P 72/7611* (2026.01); *H10P 72/7618* (2026.01); *H10P 72/7624* (2026.01)

(58) Field of Classification Search
USPC .......................................... 118/500, 728, 50
See application file for complete search history.

(56) References Cited

U.S. PATENT DOCUMENTS

| | | |
|---|---|---|
| 6,521,503 B2 | 2/2003 | Jacobson |
| 6,554,905 B1 | 4/2003 | Goodwin |
| 6,634,882 B2 | 10/2003 | Goodman |
| 6,709,267 B1 | 3/2004 | Hawkins |
| 6,729,875 B2 | 5/2004 | Goodman |
| 6,776,849 B2 | 8/2004 | Aggarwal |
| 6,840,767 B2 | 1/2005 | Goodman |

(Continued)

FOREIGN PATENT DOCUMENTS

| | | |
|---|---|---|
| JP | 2009253115 A | 10/2009 |
| JP | 5-092975 B2 | 12/2012 |

(Continued)

OTHER PUBLICATIONS

English Translation WO-2019098033-A1 (Year: 2019).*
Feb. 23, 2023—(EP) Extended EP Search Report—EP App 22203123.9.

*Primary Examiner* — Yewebdar T Tadesse
(74) *Attorney, Agent, or Firm* — Banner & Witcoff, Ltd.

(57) ABSTRACT

A substrate support includes a disc body with an upper surface and an opposite lower surface arranged along a rotation axis. The upper surface has a circular concave portion extending about the rotation axis, an annular ledge portion extending circumferentially about the concave portion, and an annular rim portion extending circumferentially about the ledge portion connecting to the concave portion of the disc body by the ledge portion of the disc body. The ledge portion slopes downward radially outward from the rotation axis to seat a substrate on the disc body such that a beveled edge of the substrate is cantilevered above the ledge portion of the upper surface of the disc body. Substrate support assemblies, semiconductor processing systems, and film deposition methods are also described.

18 Claims, 9 Drawing Sheets

(56) References Cited

U.S. PATENT DOCUMENTS

| | | | |
|---|---|---|---|
| 6,861,321 | B2 | 3/2005 | Keeton |
| 7,033,445 | B2 | 4/2006 | Keeton |
| 7,070,660 | B2 | 7/2006 | Keeton |
| 7,231,141 | B2 | 6/2007 | Jacobson |
| 7,449,071 | B2 | 11/2008 | Aggarwal |
| D600,233 | S | 9/2009 | Birsel |
| 7,601,224 | B2 | 10/2009 | Foree |
| 7,648,579 | B2 | 1/2010 | Goodman |
| 8,394,229 | B2 | 3/2013 | Aggarwal |
| 8,801,857 | B2 | 8/2014 | Aggarwal |
| 9,123,759 | B2 | 9/2015 | Miyashita |
| D743,357 | S | 11/2015 | Vyne |
| 10,732,046 | B2 | 8/2020 | Leow |
| D914,620 | S | 3/2021 | Rokkam |
| D920,936 | S | 6/2021 | Rokkam |
| D947,913 | S | 4/2022 | Patil |
| D958,764 | S | 7/2022 | Rokkam |
| 11,387,137 | B2 | 7/2022 | Aggarwal |
| 2006/0222481 | A1 | 10/2006 | Foree |

| | | | | |
|---|---|---|---|---|
| 2010/0089314 | A1* | 4/2010 | Goodman | ......... H01L 21/68735 |
| | | | | 118/500 |
| 2010/0221455 | A1 | 9/2010 | Kim et al. | |
| 2010/0227455 | A1 | 9/2010 | Fujikawa et al. | |
| 2014/0290564 | A1 | 10/2014 | Miyashita | |
| 2021/0125853 | A1 | 4/2021 | Rathi | |
| 2021/0225688 | A1 | 7/2021 | Goodman | |
| 2021/0287928 | A1 | 9/2021 | Kim | |
| 2021/0317578 | A1 | 10/2021 | Sheng et al. | |
| 2022/0130668 | A1 | 4/2022 | Tolle | |
| 2022/0172980 | A1 | 6/2022 | Aggarwal | |
| 2022/0181193 | A1 | 6/2022 | Gao | |
| 2022/0186369 | A1 | 6/2022 | Patil | |
| 2022/0189804 | A1 | 6/2022 | Luan | |
| 2022/0243324 | A1 | 8/2022 | Kim | |

FOREIGN PATENT DOCUMENTS

| | | | | |
|---|---|---|---|---|
| JP | 2015-095599 A | 5/2015 | | |
| JP | 6-459801 B2 | 1/2019 | | |
| WO | WO-9923276 A1 * | 5/1999 | .............. | G01K 1/12 |
| WO | WO-2019098033 A1 * | 5/2019 | ............. | C23C 16/24 |

* cited by examiner

10

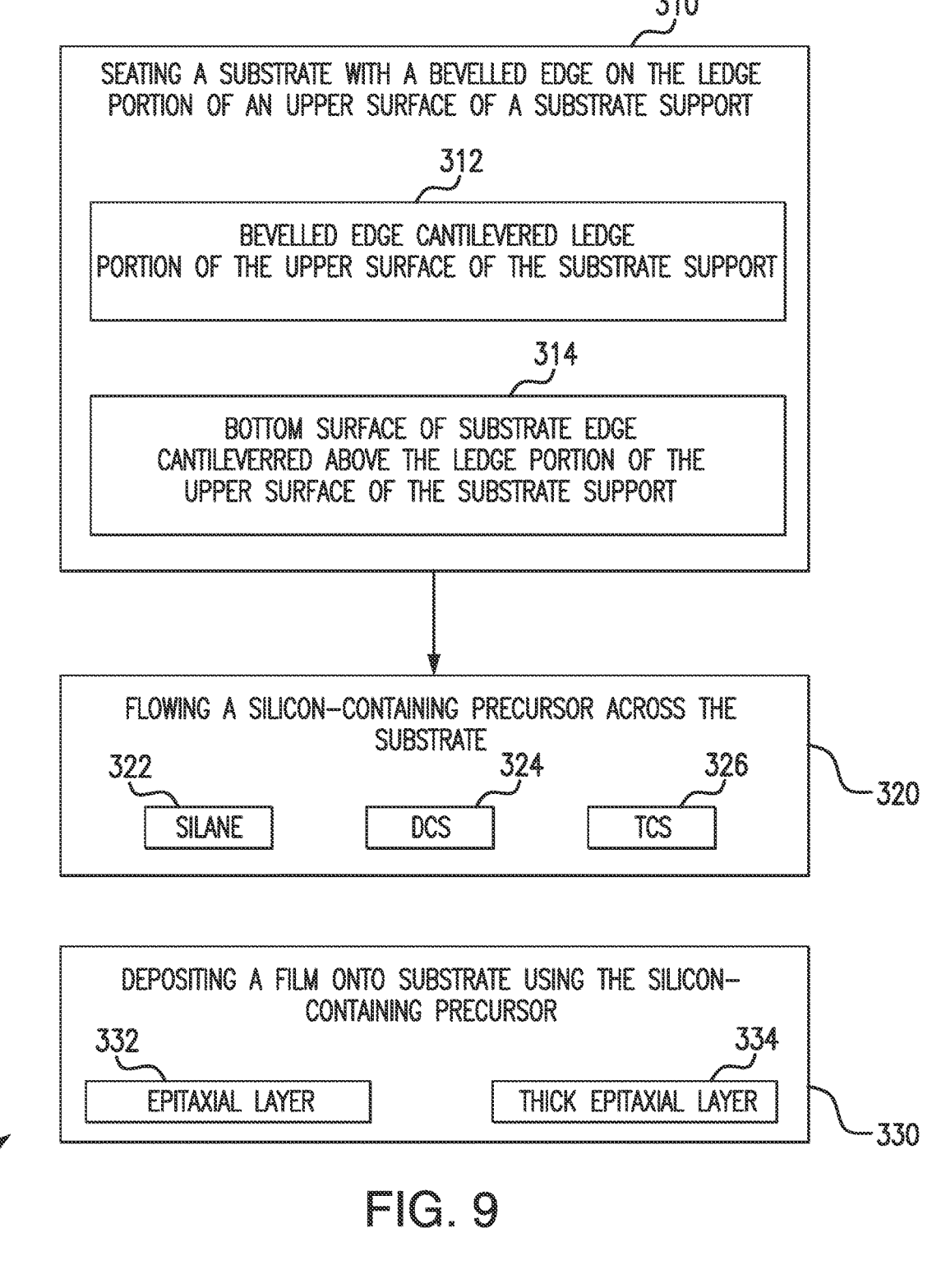

310

SEATING A SUBSTRATE WITH A BEVELLED EDGE ON THE LEDGE PORTION OF AN UPPER SURFACE OF A SUBSTRATE SUPPORT

312

BEVELLED EDGE CANTILEVERED LEDGE PORTION OF THE UPPER SURFACE OF THE SUBSTRATE SUPPORT

314

BOTTOM SURFACE OF SUBSTRATE EDGE CANTILEVERRED ABOVE THE LEDGE PORTION OF THE UPPER SURFACE OF THE SUBSTRATE SUPPORT

FLOWING A SILICON-CONTAINING PRECURSOR ACROSS THE SUBSTRATE

322 SILANE

324 DCS

326 TCS

320

DEPOSITING A FILM ONTO SUBSTRATE USING THE SILICON-CONTAINING PRECURSOR

332 EPITAXIAL LAYER

334 THICK EPITAXIAL LAYER

SUBSTRATE SUPPORTS FOR SEMICONDUCTOR PROCESSING SYSTEMS

FIELD OF INVENTION

The present disclosure generally relates to fabricating semiconductor processing systems. More particularly, the present disclosure relates to depositing films onto substrates using semiconductor processing systems during the fabrication of semiconductor devices.

BACKGROUND OF THE DISCLOSURE

Material layers are commonly deposited onto substrates during the fabrication of semiconductor devices, such as integrated circuits and power electronics devices. Material layer deposition is generally accomplished by loading a substrate (e.g., a silicon wafer) on a susceptor within a reactor. Once loaded into the reactor, the substrate is heated to a desired deposition temperature, a material layer precursor provided to the reactor, and the material layer precursor flowed across the substrate. As the material layer precursor flows through the reactor a chemical reaction occurs, causing a material layer to be deposited within the interior of the reactor. Once the material layer reaches a desired thickness, the substrate is unloaded from the reactor and sent on for further processing.

In some material layer deposition operations bridging may develop between the substrate and the susceptor supporting the substrate. Without being bound by a particular theory, it is believed that small amounts of material layer precursor flowing through the reactor may transfer (diffuse) from the flow pattern through the reactor to into flow eddies within the reactor, such as between the edge of the substrate and the susceptor supporting the substrate. Once transferred into an eddy the material layer precursor may accrete (condense) or deposit on the substrate edge and the opposing susceptor surface, the opposing accretions ultimately joining one another as bridging and thereby cooperating to mechanically fix the substrate to the susceptor. While generally manageable, bridging can introduce thermal stress during deposition of the material layer onto the substrate, potentially introducing defects into the material layer. Bridging can also increase risk of damage to the substrate and/or reactor components during unloading of the substrate from the susceptor as fracture of the bridging may require that greater force than otherwise required be exerted on the substrate during unloading. Thermal stress and risk of substrate damage generally corresponds to thickness of the material layer deposited onto the substrate, deposition operations used to deposit thick material layers typically having increased risk of thermal stress-related defects, substrate damage, and/or reactor component damage.

Various countermeasures exist to limit bridging. For example, in some material layer deposition operations the material deposition operation may be divided into two or more material layer deposition events. Dividing the material layer deposition operation into two or more deposition events allows the substrate to be unloaded from the reactor between the first material layer deposition operation and the second material layer deposition operation. As the substrate is unloaded following the first material layer deposition operation any bridging that may have formed during the first material layer deposition event is fractured, limiting the thickness of the bridging remaining between the substrate and the susceptor following the second material layer deposition event. The reduced risk of substrate and/or reactor component damage can, in some deposition operations, offset the throughput loss associated with the countermeasure.

Such systems and methods have generally been acceptable for their intended purpose. However, therein remains a need for improved substrate supports, substrate support assemblies, reaction chambers, and methods of depositing films onto substrates. The present disclosure provides a solution to this need.

SUMMARY OF THE DISCLOSURE

A substrate support is provided. The substrate support includes a disc body having an upper surface and an axially opposite lower surface arranged along a rotation axis. The upper surface of the disc body has a circular concave portion extending about the rotation axis, an annular ledge portion extending circumferentially about the concave portion, and an annular rim portion extending circumferentially about the ledge portion of the upper surface of the disc body. The rim portion of the upper surface is connected to the concave portion of the upper surface by the ledge portion of the upper surface of the disc body. The ledge portion of the upper surface of the disc body slopes downward in a direction radially outward from the rotation axis to seat a substrate on the disc body such that a beveled edge of the substrate is cantilevered above the ledge portion of the upper surface of the disc body.

In addition to one or more of the features described above, or as an alternative, further examples of the substrate support may include that the ledge portion has a radially inward seating apex extending circumferentially about the rotation axis. The ledge portion may slope downward at a negative ledge angle in a direction radially outward of the seating apex.

In addition to one or more of the features described above, or as an alternative, further examples of the substrate support may include that the negative ledge angle is between −0.2 degrees and −4 degrees, or is between −0.4 degrees and −3 degrees, or is between −0.6 degrees and −3 degrees, or is even between −0.8 degrees and −2 degrees.

In addition to one or more of the features described above, or as an alternative, further examples of the substrate support may include that the seating apex is radially offset from the rotation axis by between 140 millimeters and 149 millimeters, or between 142 millimeters and 148 millimeters, or even by between 144 millimeters and 146 millimeters.

In addition to one or more of the features described above, or as an alternative, further examples of the substrate support may include that the upper surface of the disc body has a chamfer connecting the ledge portion of the upper surface to the rim portion of the upper surface. The ledge angle may slope downward without interruption (e.g., with a continuous linear slope) between the seating apex and the chamfer at a negative ledge angle.

In addition to one or more of the features described above, or as an alternative, further examples of the substrate support may include that rim portion of the upper surface has an inner side wall, an outer side wall, an upper rim surface. The inner side wall may extend upwards from the ledge portion of the disc body. The outer side wall may be radially outward of the inner side wall and extend circumferentially about ledge portion of the upper surface of the disc body. The upper rim surface may connect the outer side wall of the rim portion to the inner side wall of the rim portion. The upper rim surface may be orthogonal relative to the rotation axis and axially offset from the seating apex of the ledge portion by a distance greater than a thickness of substrate seated on the seating apex.

In addition to one or more of the features described above, or as an alternative, further examples of the substrate support may include that the radially inner side wall of the rim portion cooperates with the concave portion and the ledge portion of the upper surface of the disc body to define a narrow pocket for seating a substrate on the disc body.

In addition to one or more of the features described above, or as an alternative, further examples of the substrate support may include that the radially inner side wall is radially offset from the rotation axis by between 150.5 millimeters and 151.5 millimeters, or between 150.6 millimeters and 151 millimeters, or even between 150.7 millimeters and 150.9 millimeters.

In addition to one or more of the features described above, or as an alternative, further examples of the substrate support may include that the seating apex extends circumferentially about the rotation axis. The upper rim surface may be between 0.8 millimeters and 2 millimeters above the seating apex. The upper rim surface may be between 0.8 millimeters and 1 millimeter above the seating apex.

In addition to one or more of the features described above, or as an alternative, further examples of the substrate support may include that the ledge portion slopes downward in a direction radially inward from a seating apex defined on the ledge portion of the upper surface of the disc body.

In addition to one or more of the features described above, or as an alternative, further examples of the substrate support may include that the ledge portion of the upper surface of the disc body slopes downward toward the concave portion at a greater angle (more steeply) than the angle at which the ledge portion slopes downward toward the rim portion of the upper surface of the disc body.

In addition to one or more of the features described above, or as an alternative, further examples of the substrate support may include the ledge portion slopes radially inward toward the concave portion from the seating apex by between −10 degrees and −20 degrees, or by between −12 degrees and −19 degrees, or even by between −14 degrees and −18 degrees.

In addition to one or more of the features described above, or as an alternative, further examples of the substrate support may include that the disc body comprises a bulk graphite material, a silicon carbide coating, and silicon-containing precoat. The silicon carbide coating may overlay the bulk graphite material. The silicon-containing precoat may overlay the silicon carbide coating. The silicon-containing precoat may have a thickness that is between about 1 micron and about 3 microns.

In addition to one or more of the features described above, or as an alternative, further examples of the substrate support may include a silicon wafer with a beveled edge seated on the ledge portion of the disc body. A silicon layer may be deposited onto a top surface of the silicon wafer. Bridging may extend between a bottom surface of the substrate and the ledge portion of the disc body. The bridging may be radially inward of the beveled edge of the silicon wafer.

In addition to one or more of the features described above, or as an alternative, further examples of the substrate support may include that the bridging is radially inward of the beveled edge by between 1 millimeter and 10 millimeters, or is radially inward of the beveled edge by between 2 millimeters and 8 millimeters, or is even radially inward of the beveled edge by between 3 millimeters and 6 millimeters.

In addition to one or more of the features described above, or as an alternative, further examples of the substrate support may include that the silicon layer has a thickness that is between 50 microns and 150 microns, or is between 60 microns and 125 microns, or is even between 70 microns and 100 microns.

In addition to one or more of the features described above, or as an alternative, further examples of the substrate support may include that the rim portion of the upper surface of the disc body has an inner side wall extending circumferentially about the rotation axis and upwards from the ledge portion of the upper surface of the disc body. The beveled edge of the substrate may be radially spaced from the inner side wall of the rim portion by between 0.5 millimeters and 1.5 millimeters, or by between 0.6 millimeters and 1.25 millimeters, or even by between 0.7 millimeters and 1 millimeter.

In addition to one or more of the features described above, or as an alternative, further examples of the substrate support may include that the circular concave portion of the substrate support has a plurality of perforations extending therethrough.

In addition to one or more of the features described above, or as an alternative, further examples of the substrate support may include that the circular concave portion of the substrate support is unperforated.

A substrate support assembly is provided. The substrate support assembly includes a substrate support as described above, a seating member, a shaft member, a divider, and a divider support. The ledge portion of the upper surface of the disc body has a radially inward seating apex extending circumferentially about the rotation axis, slopes downward in a direction radially outward of the seating apex, and further slopes downward in a direction radially inward of the seating apex. The seating member is arranged for fixation to the bottom surface of the substrate support. The shaft member is arranged for fixation to the seating member. The divider has an aperture with an aperture diameter that is greater than a diameter of the substrate support to receive therein the substrate support, and the divider support is arranged to support the divider within a reaction chamber of a semiconductor processing system employed to deposit films onto substrates supported on the substrate support.

A reaction chamber is provided. The reaction chamber includes a chamber body with an interior, a gas delivery arrangement including a silicon-containing precursor, and a substrate support as described above supported within the interior of the chamber body. The rim portion of the disc body includes an inner side wall extending upwards from the ledge portion of the disc body, an outer side wall radially outward of the inner side wall and extending circumferentially about ledge portion of the disc body, and an upper rim surface connecting the outer side wall to the inner side. The upper rim surface is substantially orthogonal to the rotation axis and is offset from a seating apex of the ledge portion by a distance greater than a thickness of substrate seated on the seating apex. The ledge portion of the disc body slopes downward in a direction radially from a seating apex defined on the ledge portion of the disc body.

A film deposition method is provided. The method includes, at a substrate support as described above, seating a substrate with a beveled edge on the ledge portion of the substrate support, flowing a silicon-containing precursor across the substrate, and depositing a silicon film onto the substrate using the silicon containing precursor. Seating the substrate on the substrate support includes cantilevering a beveled edge of the substrate above the edge portion of the upper surface of the disc body.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
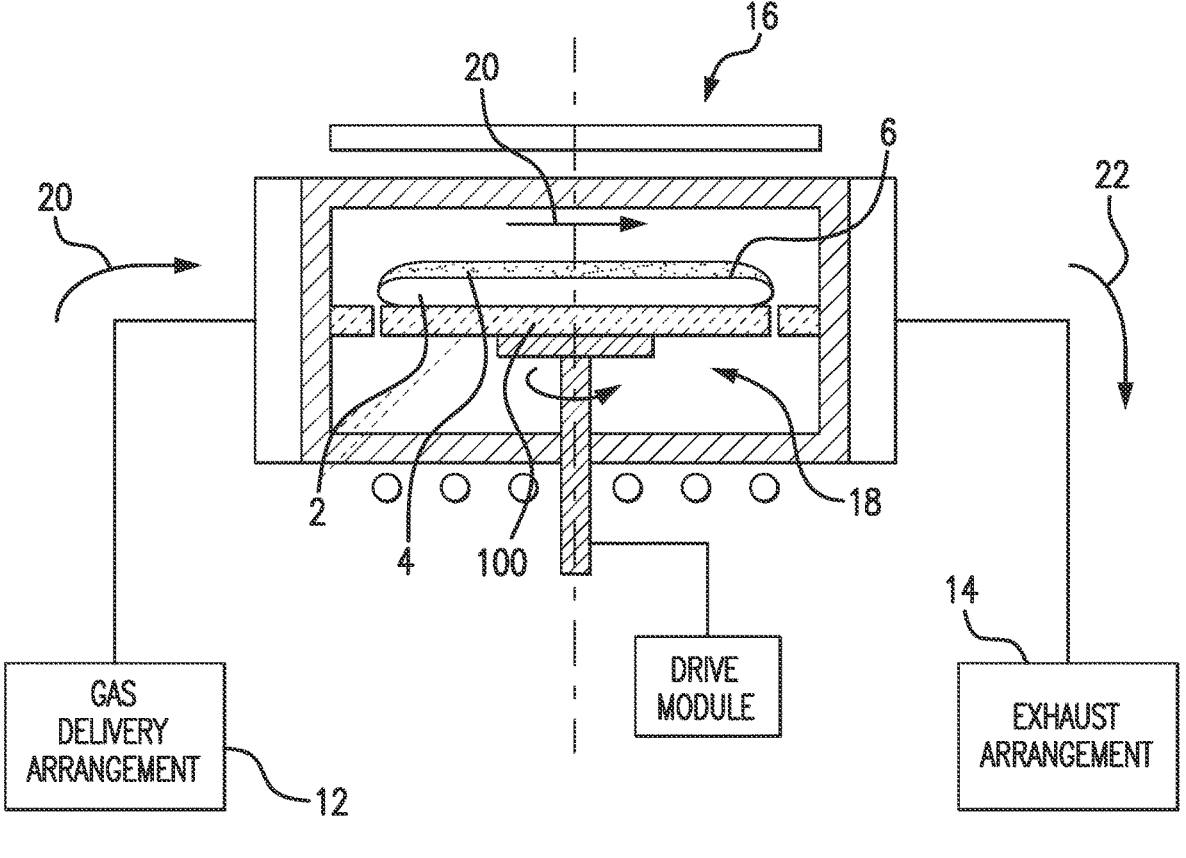
FIG. 1 is a schematic view of a semiconductor processing system in accordance with the present disclosure, showing a gas delivery arrangement connected to a reaction chamber with a substrate support arranged within an interior of the reaction chamber.
Figure 8:
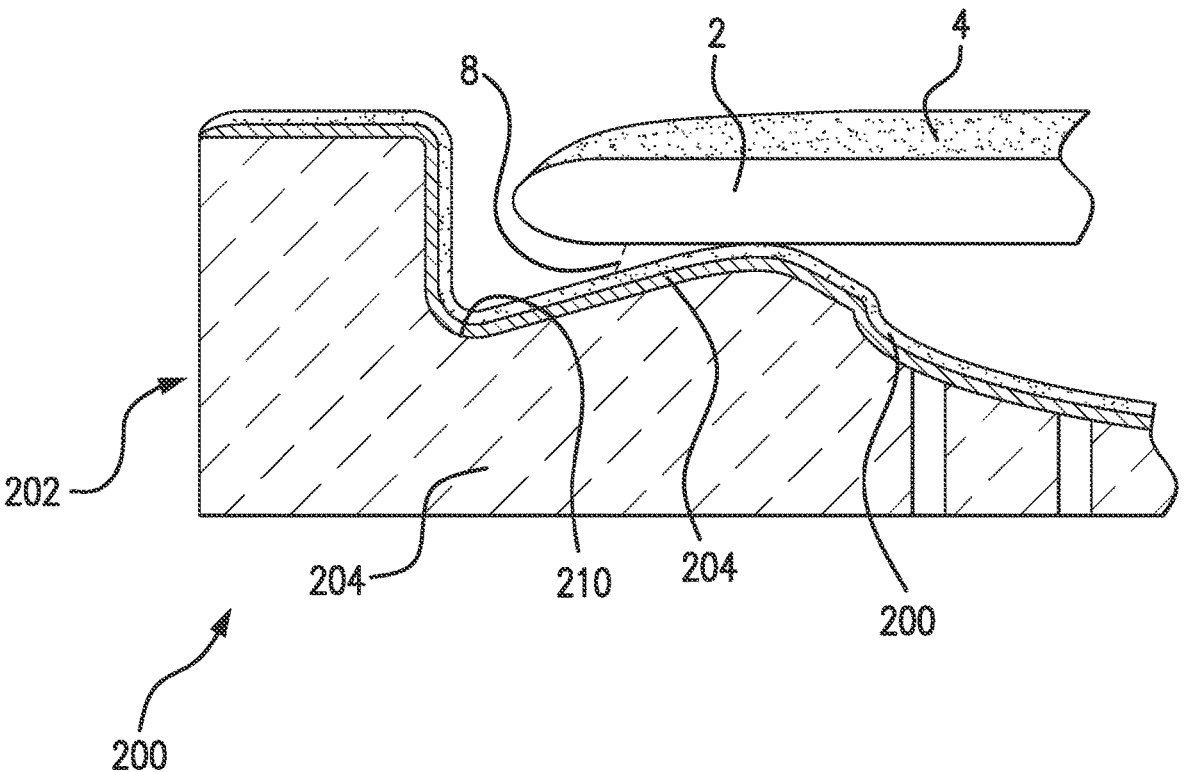

FIG. 8 is a cross-sectional view of a portion of the substrate support of FIG. 1 according to an example, showing a bulk graphite material forming the disc body coated with a silicon carbide coating overlaying the bulk graphite material and a silicon-containing precoat overlaying the silicon carbide coating; and FIG. 9 is a block diagram of a film deposition method, showing operations of the film deposition method according to an illustrative and non-limiting example of the method.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a partial view of an example of a substrate support (e.g., a susceptor) in accordance with the present disclosure is shown in FIG. 1 and is designated generally by reference character 100. Other examples of substrate supports, substrate support assemblies, reaction chambers, and film deposition methods in accordance with the present disclosure, or aspects thereof, are provided in FIGS. 2-9, as will be described. The systems and methods of the present disclosure can be used to deposit films onto substrates during the fabrication of semiconductor devices, such as during the deposition of thick epitaxial films during the fabrication of power electronics semiconductor devices, though the present disclosure is not limited to any particular semiconductor device or to the deposition of thick epitaxial films in general.

Referring to FIG. 1, a semiconductor processing system 10 is shown. The semiconductor processing system 10 includes a gas delivery arrangement 12, an exhaust arrangement 14, and a reaction chamber 16 with a substrate support assembly 18 including the substrate support 100. The gas delivery arrangement 12 is connected to the reaction chamber 16 and is configured to provide a film precursor 20 to the reaction chamber 16. The reaction chamber 16 is configured flow the film precursor 20 across a substrate 2, e.g., a blanket or patterned silicon wafer, during deposition of a film 4 onto an upper surface 6 of the substrate 2, e.g., using a chemical vapor deposition technique such as epitaxy. The exhaust arrangement 14 is fluidly coupled to the gas delivery arrangement 12 by the reaction chamber 16 and is configured to receive a flow of residual precursor and/or reaction products 22 issued by the reaction chamber 16. In this respect the exhaust arrangement 14 may include a vacuum pump and/or an abatement device, such as a scrubber by way of example.

Figure 2:
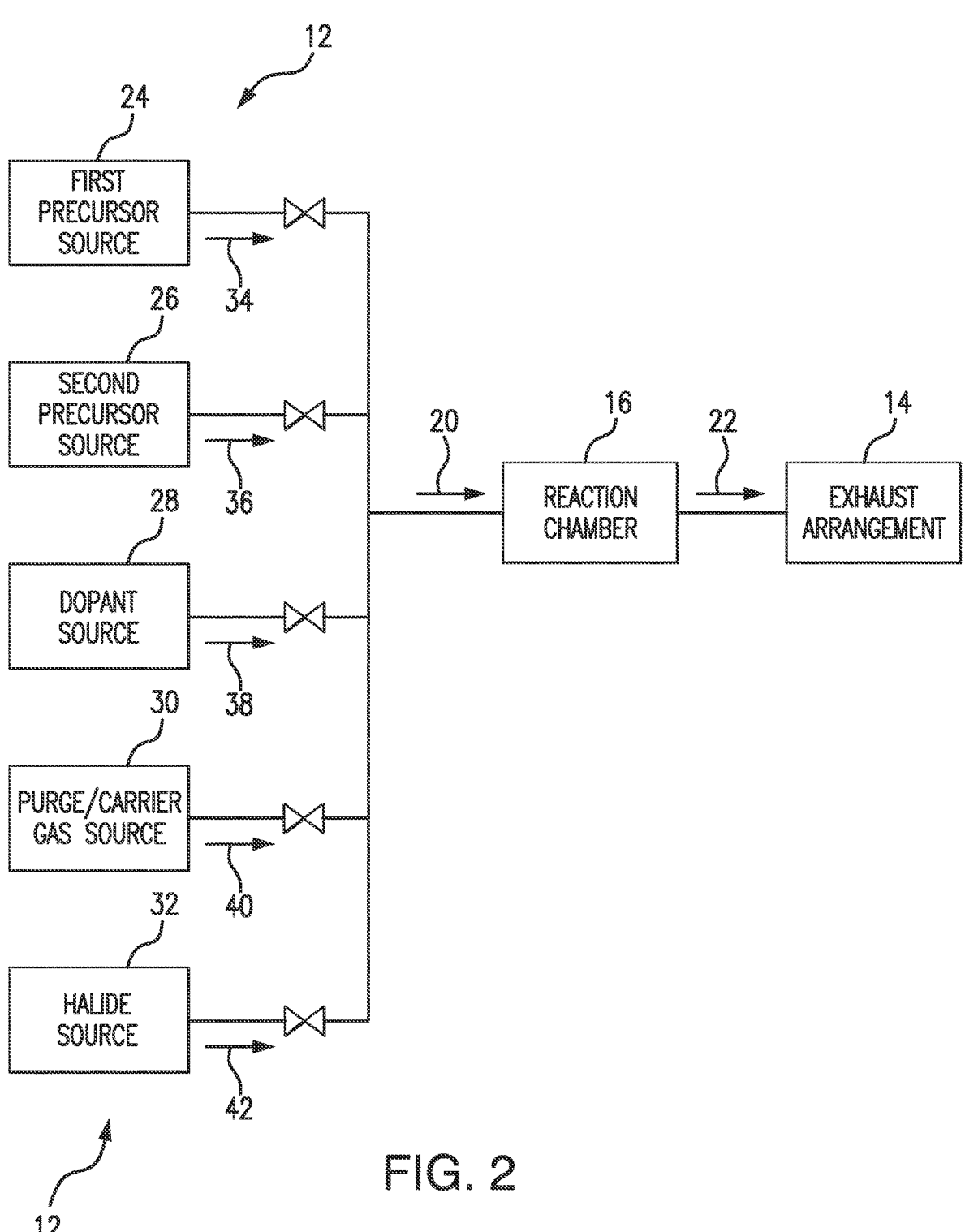
FIG. 2 is a schematic view of the gas delivery arrangement of FIG. 1 according to an example, showing the gas delivery arrangement providing a silicon-containing precursor to the reaction chamber to deposit a film onto a substrate seated on the substrate support.

With reference to FIG. 2, the gas delivery arrangement 12 is shown. In the illustrated example the gas delivery arrangement 12 includes a first precursor source 24, a second precursor source 26, and a dopant source 28. The gas delivery arrangement 12 also includes a purge/carrier gas source 30 and a halide source 32. The first precursor source 24 is connected to the reaction chamber 16, includes a silicon-containing precursor 34, and is configured to provide a flow of the silicon-containing precursor 34 to the reaction chamber 16. Examples of suitable silicon-containing precursors include one or more of silane (SiH$_4$), dichlorosilane (DCS), and trichlorosilane (TCS). The second precursor source 26 is similarly connected to the reaction chamber 16, includes a germanium-containing precursor 36, and is configured to provide a flow of the germanium-containing precursor 36 to the reaction chamber 16. Examples of suitable germanium-containing precursors include germane (GeH$_4$).

The dopant source 28 is connected to the reaction chamber 16, includes a dopant-containing precursor 38, and is configured to provide a flow to the dopant-containing precursor 38 to the reaction chamber 16. Examples of suitable dopants include boron, arsenic, and phosphorous. The purge/carrier gas source 30 is connected to the reaction chamber 16, includes a purge/carrier gas 40, and is configured to provide a flow of the purge/carrier gas 40 to the reaction chamber 16. Examples of suitable purge/carrier gases include hydrogen (H$_2$), argon (Ar), and helium (He). The halide source 32 is connected to the reaction chamber 16, includes a halide-containing material 42, and is configured to provide a flow of the halide-containing material 42 to the reaction chamber 16. Examples of suitable halide-containing materials include hydrochloric acid (HCl). In certain examples the gas delivery arrangement 12 may be as shown and described in U.S. Patent Application Publication No. 2020/0040458 A1 to Ma et al., filed on Aug. 6, 2018, the contents of which are incorporated herein by reference in its entirety. However, as will be appreciated by those of skill in the art in view of the present disclosure, the gas delivery arrangement 12 may have another arrangement and remain within the scope of the present disclosure.

Figure 3:
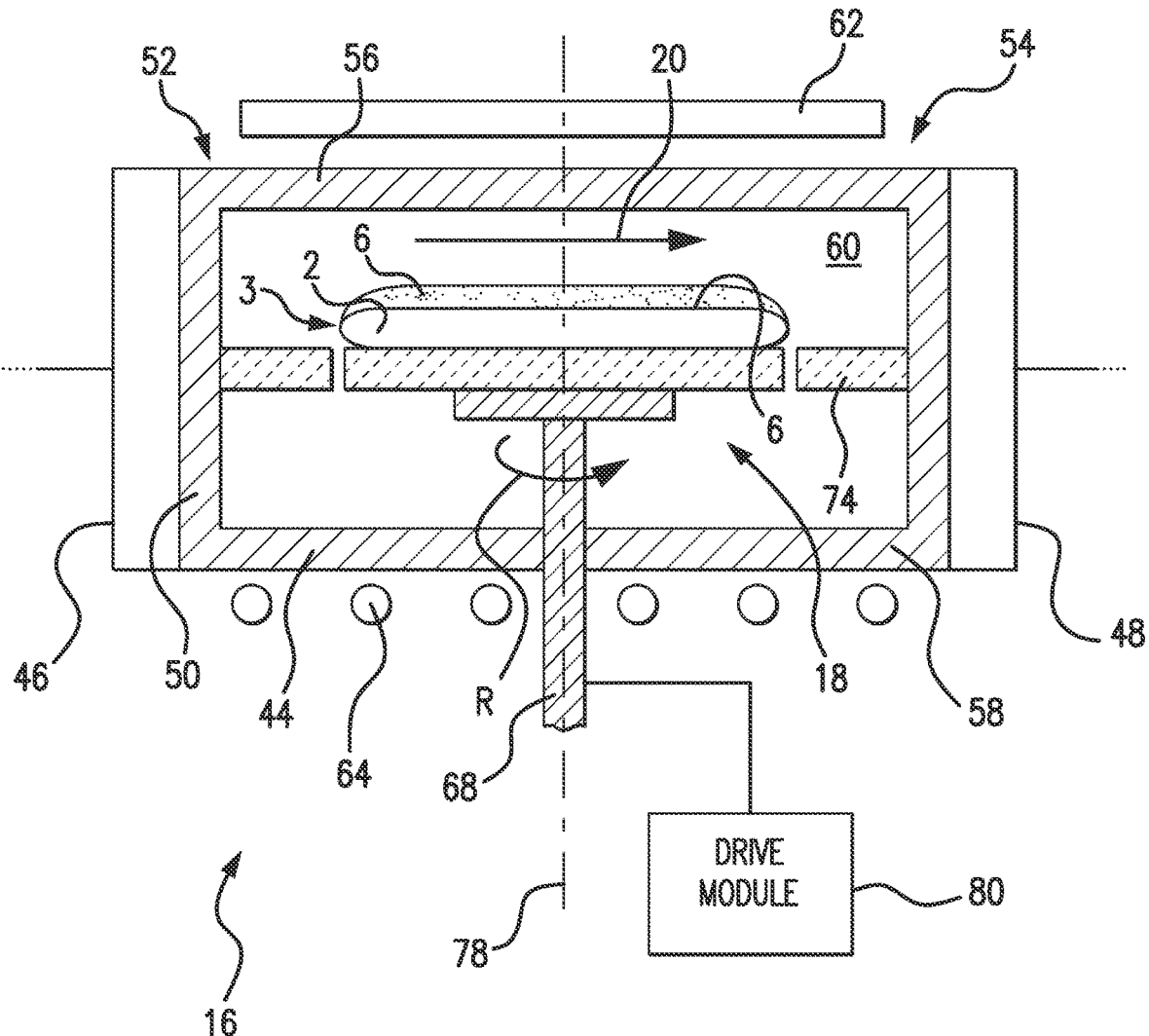
FIG. 3 is schematic view of the reaction chamber of FIG. 1 according to an example, showing a substrate support assembly with a substrate support arranged in the reaction chamber and supporting a substrate during deposition of a film onto the substrate.

With reference to FIG. 3, the reaction chamber 16 is shown. In illustrated example the reaction chamber 16 includes a chamber body 44, an injection flange 46, an exhaust flange 48, and the substrate support assembly 18 with the substrate support 100. The chamber body 44 is formed from a transparent material 50 and has an injection end 52, an opposite exhaust end 54, an upper wall 56, and a lower wall 58. The injection flange 46 is connected to the injection end 52 of the chamber body 44 and fluidly couples the gas delivery arrangement 12 (shown in FIG. 1) to an interior 60 of the chamber body 44. The exhaust flange 48 is connected to the exhaust end 54 of the chamber body 44 and fluidly couples the interior 60 of the chamber body 44 to the exhaust arrangement 14 (shown in FIG. 1). The upper wall 56 of the chamber body 44 extends between the injection end 52 and the exhaust end 54 of the chamber body 44, and is formed from the transparent material 50. The lower wall 58 of the chamber body 44 is spaced apart from the lower wall 58 of the chamber body 44, and is also formed from the transparent material 50. In certain examples the transparent material 50 may include a ceramic material, such as quartz. In accordance with certain examples, the chamber body may include a plurality of external ribs extending about the exterior of the chamber body 44. It is also contemplated that, in accordance with certain examples, an upper lamp bank 62 and a lower lamp bank 64 may be supported above and below the chamber body 44, respectively, to communicate heat radiantly into the interior 60 of the chamber body 44. As used herein the terms "upper" and "lower" refer to the relative position of elements (or portions of a singular element) in relation to gravity, the upper wall 56 of the chamber body 44 in this respect arranged above the lower wall 58 of the chamber body 44 relative to gravity.

Figure 4:
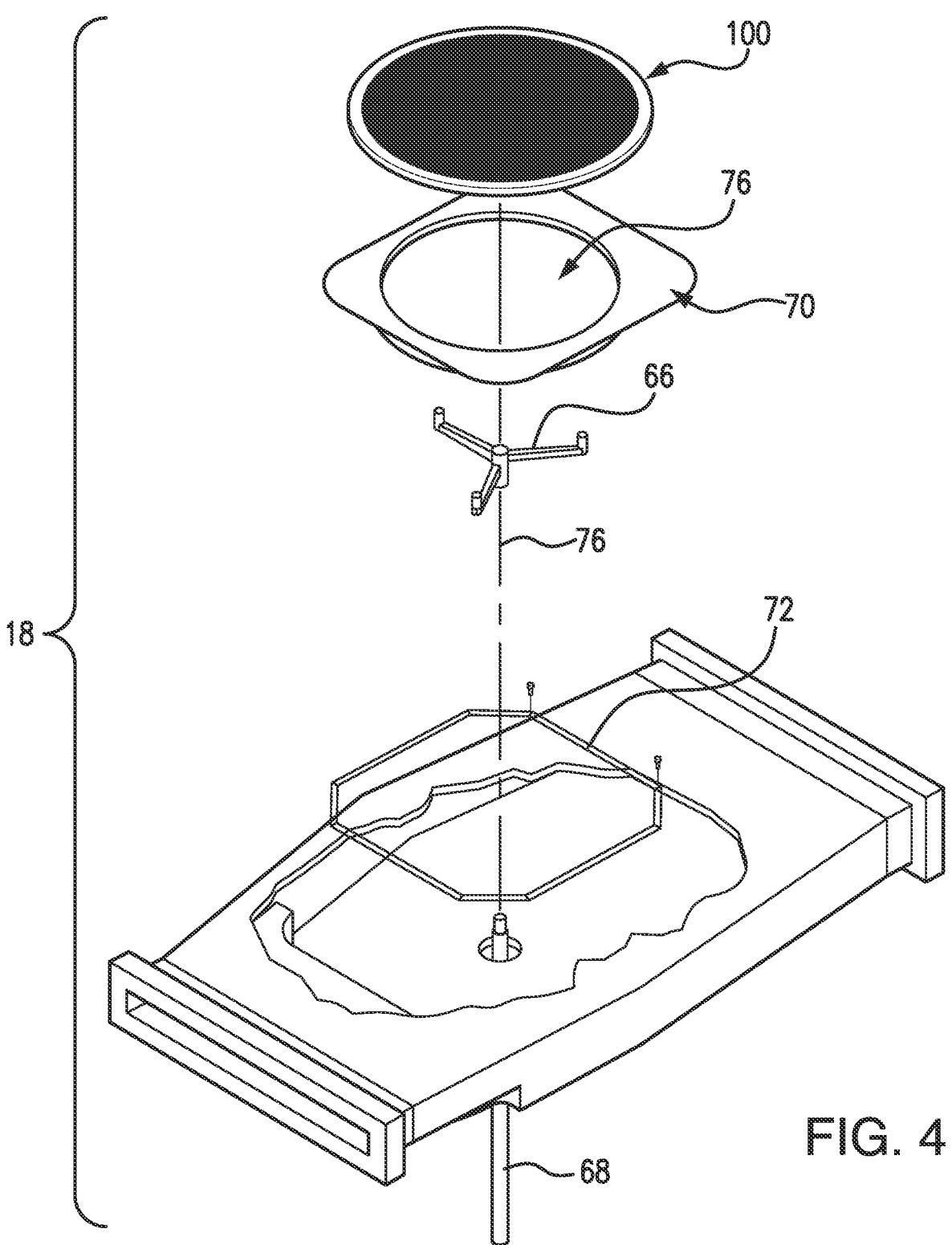
FIG. 4 is an exploded view of the substrate support assembly of FIG. 3 according to an example, showing the substrate support exploded away from a support member, a shaft, a divider, and a divider support.

With reference to FIG. 4, the substrate support assembly 18 includes the substrate support 100, a seating member 66, a shaft member 68, a divider 70, and a divider support 72. The divider 70 is fixed within the interior 60 of the chamber body 44 (shown in FIG. 3), is formed from an opaque material 74 (shown in FIG. 3), divides the interior 60 of the chamber body 44 into an upper chamber and a lower chamber, and has an aperture 76 extending therethrough coupling the upper chamber to the lower chamber of the chamber body 44. It is contemplated that the divider 70 be supported within the interior 60 of the chamber body 44 by the divider support 72, which may be formed from a transparent material. In certain examples the opaque material 74 forming the divider 70 may include a graphite material, such as silicon carbide coated graphite material by way of non-limiting example.

The substrate support 100, e.g., a susceptor, is arranged within the interior 60 of the chamber body 44, is supported for rotation R about the rotation axis 78, and is configured to support the substrate 2 during the deposition of the film 4 onto the upper surface 6 of the substrate 2. More specifically, the substrate support 100 is arranged within the aperture 76 extending through the divider 70 and along a rotation axis 78, the aperture 76 have an aperture diameter 82 that is greater than a diameter 102 of the substrate support

100 (shown in FIG. 4). The seating member 66 is arranged within the lower chamber of the chamber body 44, is fixed in rotation relative to the substrate support 100, and may also be formed from a transparent material. The shaft member 68 is arranged along the rotation axis 78, is fixed in rotation relative to the seating member 66, extends through the lower wall 58 of the chamber body 44 to operably couple the substrate support 100 to a drive module 80, and may be formed from a transparent material. The drive module 80 is operably connected to the substrate support 100 by the shaft member 68 and the seating member 66 and is configured to rotate R the substrate support 100 about the rotation axis 78 during deposition of the film 4 onto the upper surface 6 of the substrate 2. The transparent material forming one or more of the seating member 66, the shaft member 68, and the divider support 72 may be the transparent material 50.

As has been explained above, bridging may form between a film deposited onto a substrate and the substrate support seating the substrate during deposition of the film onto the upper surface of the substrate. While generally manageable, the bridging can increase risk of damage to the substrate and/or reaction chamber components, for example, due to thermal stress associated with the bridging and/or due to stress exerted on the substrate and/or reaction chamber components associated with the force required to fracture the bridging during unseating of the substrate from the substrate support structure. Without being bound by a particular theory, it is believed that, in some deposition processes, silicon-containing precursor may diffuse into a gap defined between the periphery (e.g., a beveled edge) of the substrate and the substrate support seating the substrate, the silicon-containing precursor causing bridging to form between the substrate and the substrate support with a thickness corresponding to thickness of the film deposited onto the surface the substrate, risk of substrate damage and/or reaction chamber component damage typically corresponding to thickness of the film deposited onto the surface of the substrate while seated on the substrate support. To limit (or eliminate) risk of damage to the substrate 2 and/or components within the reaction chamber 16, the substrate support 100 is provided.

Figure 5:
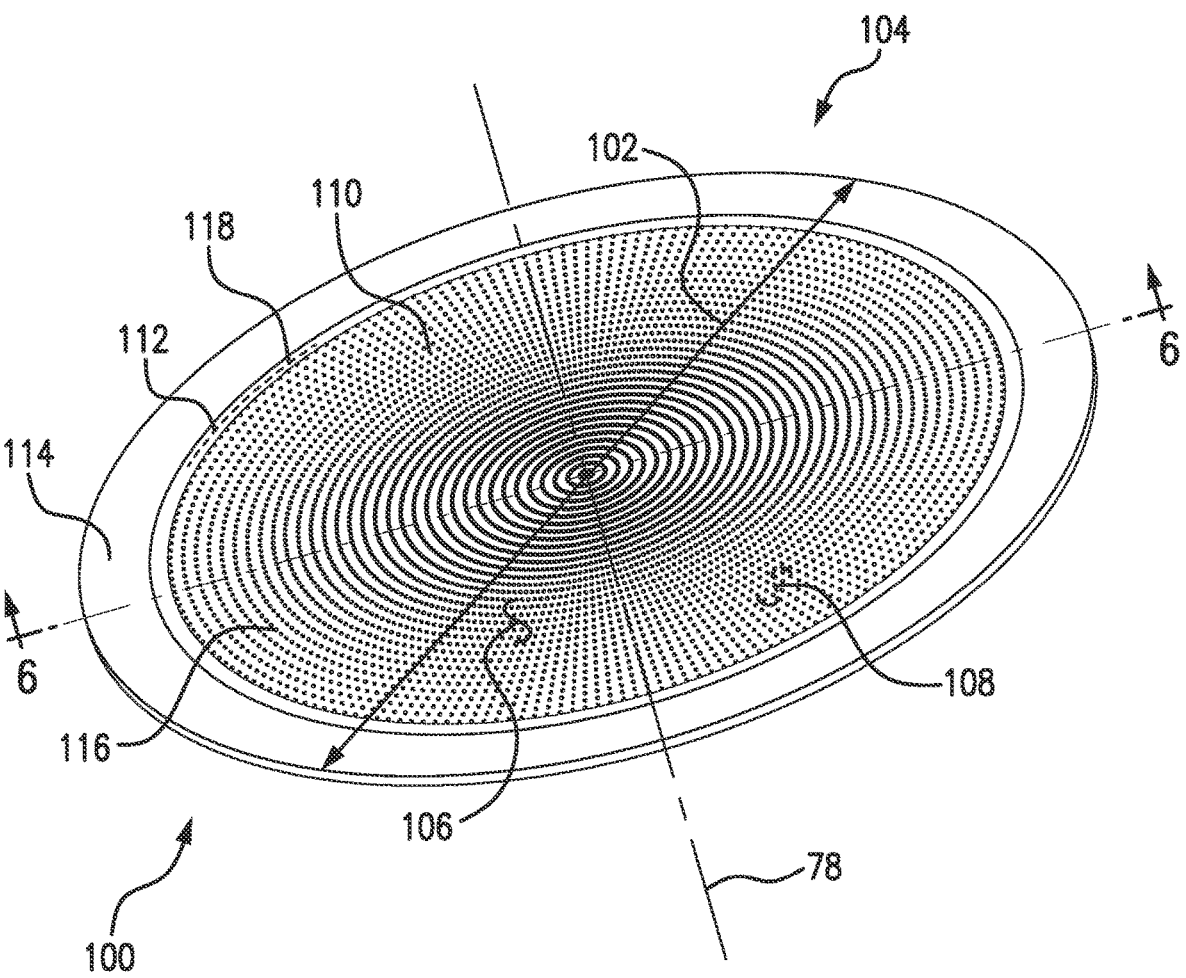
FIG. 5 is a perspective view of the substrate support of FIG. 1 according to an example, showing a disc body having an upper surface with a concave portion connected to a rim portion by a ledge portion.

With reference to FIG. 5, the substrate support 100 is shown. The substrate support 100 generally includes a disc body 104 with an upper surface 106 and an opposite lower surface 108 arranged along the rotation axis 78. The upper surface 106 of the disc body 104 has a circular concave portion 110 extending about the rotation axis, an annular ledge portion 112 extending circumferentially about the concave portion 110 of the disc body 104, and an annular rim portion 114 extending circumferentially about the ledge portion 112 of the disc body 104 and connecting to the concave portion 110 of the disc body 104 to the ledge portion 112 of the disc body 104. The ledge portion 112 of the disc body 104 slopes downward in a direction radially-outward from the rotation axis to seat a substrate, e.g., the substrate 2 (shown in FIG. 1), on the ledge portion 112 of the disc body 104 such that a beveled periphery 3 (shown in FIG. 3) of the substrate 2 is cantilevered above the ledge portion 112 of the upper surface 106 of the disc body 104.

In certain examples, the circular concave portion 110 may have a plurality of perforations 116 extending therethrough. The plurality of perforations 116 fluidly couple the lower surface 108 of the disc body 104 to the upper surface of the disc body 104. In this respect it is contemplated that the plurality of perforations 116 fluidly couple the lower chamber of the chamber body 44 (shown in FIG. 3) with a space within the upper chamber of the chamber body 44 defined between the concave portion 100 and the substrate 2 (shown in FIG. 1). In accordance with certain examples, the concave portion 110 may have a plurality of through-holes extending therethrough. In such examples a lift pin may be slidably received within each of the plurality of through-holes, the lift pins in such examples configured to translate along the rotation axis 78 to seat and unseat the substrate from the upper surface 106 of the disc body 104.

In certain examples, the circular concave portion 110 of the disc body 104 may have no perforations. As will be appreciated by those of skill in the art in view of the present disclosure, the circular concave portion 110 of the disc body 104 may provide less (if any) fluid communication between the lower chamber of the chamber body 44 (shown in FIG. 3) and the space defined between the substrate and the susceptor 100 in the upper chamber of the chamber body 44. Advantageously, examples of the susceptor 100 having no perforations may reduce (or eliminate) risk of backside artifacts developing processes where an etchant is included with (or as) a purge to the lower chamber of the chamber body 44, enabling greater amounts of etchant to be provided without a corresponding increase in risk of backside etching (and artifact generation) on the lower surface of the substrate.

Figure 6:
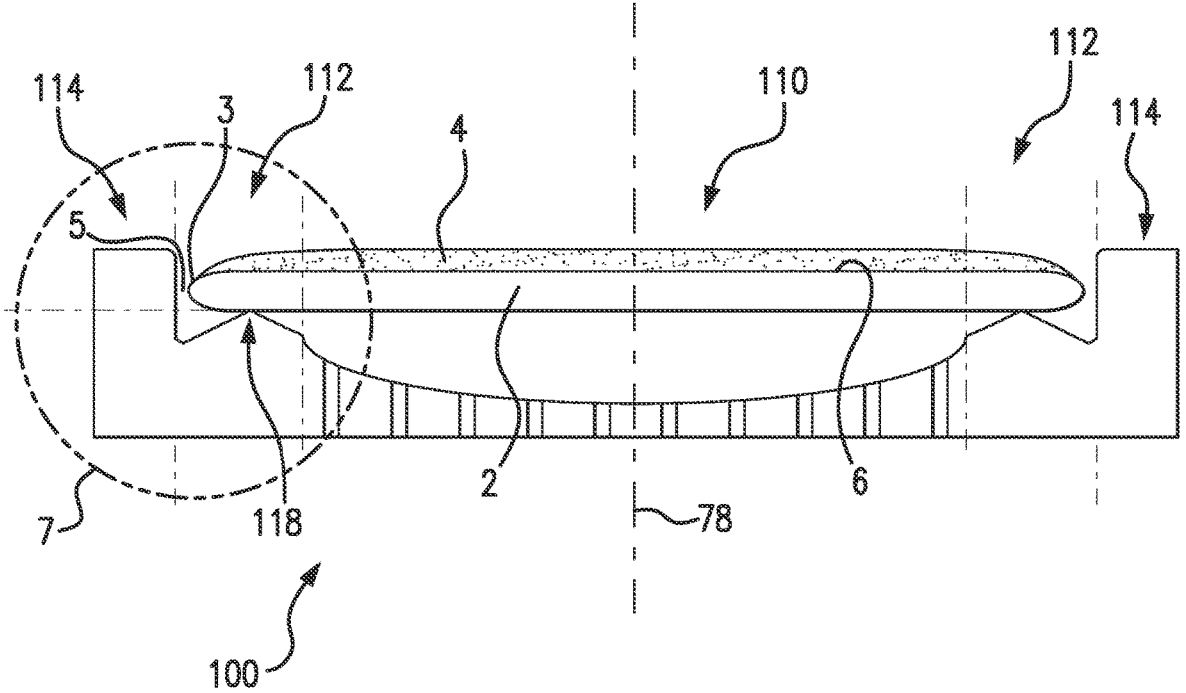
FIG. 6 is cross-sectional side view of the substrate support of FIG. 1 according to an example, showing the ledge portion sloping downward from a seating apex in a radially outward direction such that a beveled edge of the substrate is cantilevered above the ledge portion of the upper surface of the disc body.

With reference to FIG. 6, the annular ledge portion 112 has a radially inward seating apex 118. The radially inward seating apex 118 extends circumferentially about the rotation axis 78 and slopes downward from seating apex 118 at a radially outer ledge angle 120 (relative to horizontal or lower surface of the substrate 2). It is contemplated that the ledge angle 120 be a negative radially outer ledge angle 120. In this respect the ledge angle is negative relative to a line orthogonal relative to the rotation axis 78. In certain examples the ledge angle 120 may be between about −0.2 degrees and about −4 degrees, or between about −0.4 degrees and about −3 degrees, or between about −0.6 degrees and about −3 degrees, or even between about −0.8 degrees and about −2 degrees. In accordance with certain examples, the ledge angle may be about −1 degrees. As will be appreciated by those of skill in the art in view of the present disclosure, ledge angles within these ranges can cooperate with the radial spacing of the seating apex 118 to cantilever the beveled periphery 3 of the substrate 2 over the ledge portion 112 of the disc body 104 to limit transfer (diffusion) of the film precursor 20 (shown in FIG. 1) into a gap 5 defined between the beveled periphery 3 of the substrate 2 and the rim portion 114 of the substrate support 100. As will also be appreciated by those of skill in the art in view of the present disclosure, limiting transfer of the film precursor 20 into the gap 5 can in turn limit (or eliminate) bridging formed within the gap 5 during deposition of the film 4 onto the upper surface of the substrate 2.

It is contemplated that the seating apex 118 extend circumferentially about the rotation axis 78 continuously, e.g., without interruption. It is also contemplated that the seating apex 118 be radially offset from the rotation axis 78 by a distance smaller than the radial offset of the beveled edge of a substrate, e.g., the substrate 2, seated on the substrate support 100. For example, in examples where the substrate 2 includes a 300-millimeter silicon wafer, the seating apex 118 may be radially offset from the rotation axis 78 by between about 140 millimeters and about 149 millimeters, or between about 142 millimeters and about 148 millimeters, or even between about 144 millimeters and about 146 millimeters. The seating apex 118 may be radially offset from the rotation axis by about 145.75 millimeters. Applicant has determined that radial offsets within these ranges sufficiently separate the lower surface of the substrate 2 between seating apex 118 and the beveled edge of the substrate by distances that operate to limit (or prevent) diffusion of precursor into the gap defined between the lower surface of the substrate 2 between the seating apex 118 and beveled edge of the substrate 2 and the ledge portion 112.

Figure 7:
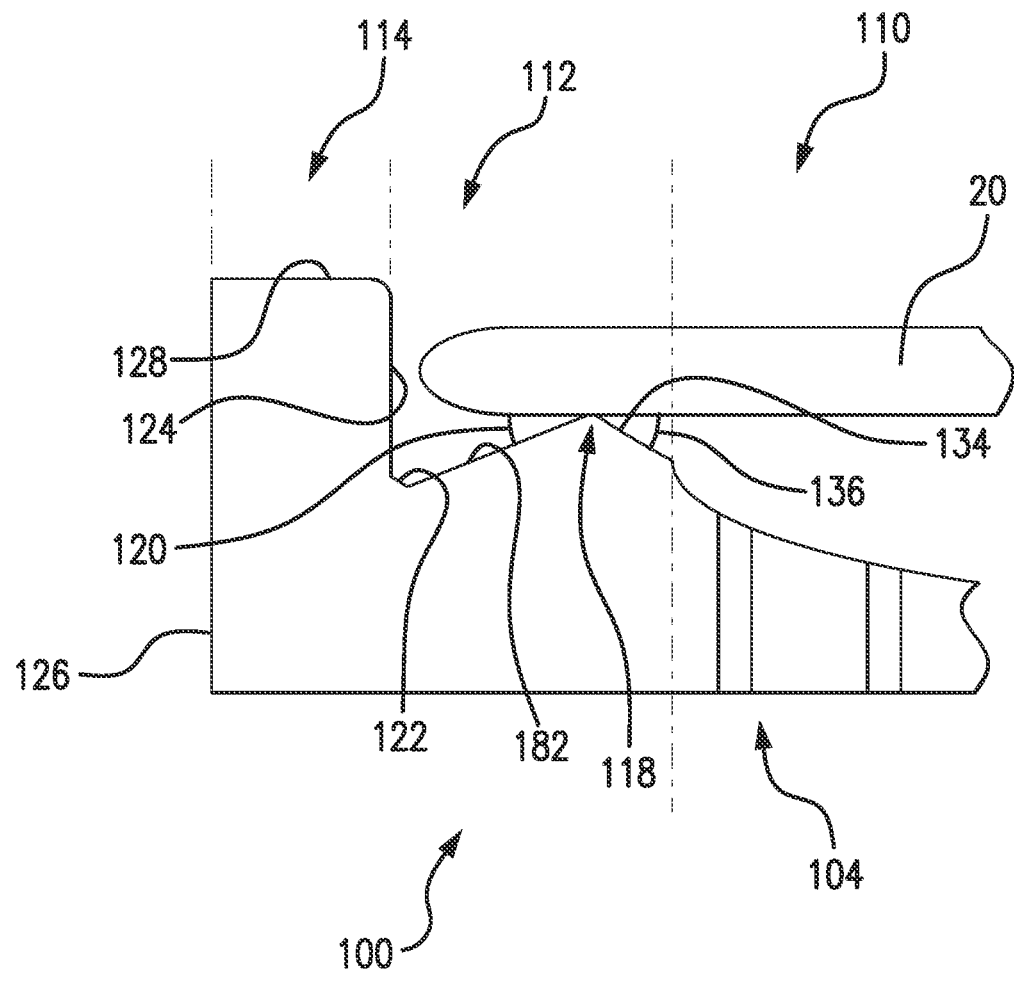
FIG. 7 is a cross-sectional view of a portion of the substrate support of FIG. 1 according to an example, showing the ledge portion sloping downward from the seating apex in both a radially inward direction and a radially outward direction from the seating apex.

With reference to FIG. 7, a portion of the substrate support 100 is shown. In the illustrated example the upper surface 106 of the disc body 104 has a chamfer 182. The chamfer 182 connects the rim portion 114 of the disc body 104 to the ledge portion 112 of the disc body 104. The chamfer 182 further extends circumferentially about the ledge portion 112 of the disc body 104, the chamfer 182 being radially adjacent to a radially outer minima 122 of the ledge portion 112. As will be appreciated by those of skill in the art in view of the present disclosure, inclusion of the chamfer 182 in the disc body 104 reduces thermal stress exerted on the disc body 104 during deposition of the film 4 onto the upper surface 6 of the substrate 2. This potentially increases the deposition temperature and/or the number of thermal cycles that the substrate support 100 may tolerate prior to requiring replacement.

It is contemplated that the rim portion 114 of the disc body 104 have an inner side wall 124, an outer side wall 126, and an upper rim surface 128. The inner side wall 124 extends upwards from the ledge portion 112 of the disc body 104, e.g., from the radially outer minima 122 or the chamfer 182, and extends circumferentially about the rotation axis 78 (shown in FIG. 3). The outer side wall 126 is radially outward of the inner side wall 124, extends circumferentially about the ledge portion 112 of the disc body 104, and is spaced apart from the inner side wall 124 by a radial width of upper rim surface 128 of the disc body 104. The upper rim surface 128 connects the outer side wall 126 of the rim portion 114 to the inner side wall 124 of the rim portion 114 of the disc body 104. It is contemplated that the upper rim surface 128 of the rim portion 114 be substantially orthogonal relative to the rotation axis 78, which limits the disturbance otherwise presented by a radial gap defined between the outer side wall 126 and the aperture 76 (shown in FIG. 4) extending through the divider 70 of the substrate support assembly 18. It is contemplated that the inner side wall 124 be radially offset from the rotation axis 78 by a distance greater than a radius of the substrate 2 seated on the substrate support 100.

It is contemplated that the radially inner side wall 124 of the rim portion 114 cooperate with the concave portion 110 and the ledge portion 112 to define a narrow pocket for seating the substrate 2 on the substrate support 100. As used herein the term 'narrow pocket' refers to a diametrical dimension defined by the radially inner side wall 124 that is substantially equivalent to the diameter of the substrate 2, e.g., about 300 millimeters in examples where the substrate 2 includes a 300-millimeter silicon wafer, plus about 1.2 times the process capability of the lift pin arrangement employed to seat the substrate 2 on the substrate support 100. In certain examples the radially inner side wall 124 may be radially offset from the rotation axis 78 by between about 150.5 millimeters and about 151.5 millimeters, or between about 150.6 millimeters and about 151 millimeters, or even between about 150.7 millimeters and about 150.9 millimeters. For example, when the substrate 2 is centered on the substrate support 100, the radially inner side wall 124 of the rim portion 114 may be radially offset from the beveled edge of the substrate by about 0.75 millimeters. As will be appreciated by those of skill in the art in view of the present disclosure, radially offsetting the radially inner side wall 124 by distances within this range can also limit diffusion of precursor into the gap defined between the ledge portion 112 and the lower surface of the substrate 2 radially outward of the seating apex 118, also limiting thickness of bridging formed during deposition of the film 4 onto the upper surface 6 of the substrate 2.

In certain examples, the upper rim surface 128 may be above the seating apex 118. In certain examples, the upper rim surface 128 may be axially offset from the seating apex 118 by a distance greater than a thickness of the substrate 2, e.g., more than about 0.75 millimeters in examples where the substrate 2 includes a 300-millimeter silicon wafer. For example, the upper rim surface 128 of the seating apex 188 may be offset from the seating apex 118 between about 0.8 millimeters and about 2 millimeters, or between about 0.8 millimeters and about 1.5 millimeters, or even between about 0.8 millimeters and about 1 millimeters above the seating apex 118. Offsets within these ranges can cooperate with width of a radial gap defined between the beveled edge of the substrate 2 and the inner side wall 124 of the rim portion 114 of the disc body 104 to limit (or eliminate) vertical flow components in the flow of the film precursor 20 flowing above the radial gap.

In certain examples, the downward slope of the ledge portion 112 may define a radially-outer downward sloping segment 132 and the ledge portion 112 may have a radially-inner downward sloping segment 134 located radially inward of the radially-outer downward sloping segment 132. In such examples the seating apex 118 may be radially interposed between the radially-outer downward sloping segment 132 and the radially-inner downward sloping segment 134. It is contemplated that the radially-outer downward sloping segment 132 extend circumferentially continuously about the rotation axis 78 (shown in FIG. 3), that the seating apex 118 extend circumferentially continuously about the rotation axis 78, and that the radially-inner downward sloping segment 134 extend circumferentially continuously about the rotation axis 78.

In certain examples, the ledge portion 112 of the disc body 104 may slope downward toward the concave portion 110 of the upper surface 106 of the disc body 104 with greater steepness than steepness at which the ledge portion 112 slopes downward toward the rim portion 114 of the upper surface 106 of the disc body 104. In this respect the radially-inner downward sloping segment 134 has negative slope of greater magnitude than the negative slope of the radially-outer downward sloping segment 132. For example, the radially-inner downward sloping segment 134 may have a radially inner ledge angle 136 (relative to horizontal or to the lower surface of the substrate 2) that is between about −10 degrees and about −20 degrees, or is between about −12 degrees and about −19 degrees, or is between about −14 degrees and about −18 degrees. The radially-inner downward sloping segment 134 may have a radially inner ledge angle 136 that is about −16 degrees. As will be appreciated by those of skill in the art in view of the present disclosure, slopes within these ranges can provide suitable spacing between the cantilevered portion of the substrate 2 and radially-outer downward sloping segment 132 and suitable spacing between the simply supported portion of the substrate and concave portion 110 of the upper surface 106 of the disc body 104, limiting temperature differential within the substrate otherwise associated with cantilevering the beveled periphery 3 of the substrate 2 over the radially-outer downward sloping segment 132.

With reference to FIG. 8, a substrate support 200 is shown. The substrate support 200 is similar to the substrate support 100 (shown in FIG. 1) and additionally includes a disc body 202, a silicon carbide coating 204, and a silicon-containing precoat 206. The disc body 202 is formed from a bulk graphite material 208, which allows the disc body to absorb radiant energy from the upper lamp bank 62 (shown in FIG. 3) and the lower lamp bank 64 (shown in FIG. 3). The silicon carbide coating 204 overlays the bulk graphite material 208 and is configured to separate the bulk graphite material 208 from the film precursor 20 flowing across the substrate 2. The silicon-containing precoat 206 overlays the silicon carbide coating 204 and may be formed in-situ using the film precursor 20 (shown in FIG. 1).

In certain examples, the silicon-containing precoat 206 may cooperate with the geometry of a ledge portion 210 of the disc body 202 to limit (or eliminate) risk of substrate damage in the event that bridging 8 forms between the silicon-containing precoat 206 and the lower surface of the substrate 2. In this respect the silicon-containing precoat 206 increases the likelihood that, in the event that the bridging 8 does develop during the deposition of the film 4 onto the upper surface 6 of the substrate 2, that the bridging 8 causes a tear-out artifact at the location of the bridging 8 during unseating the substrate 2 from the substrate support 200. As will be appreciated by those of skill in the art in view of the present disclosure, tear-out artifacts are preferable to substrate damage and/or damage to components within reaction chamber 16 (shown in FIG. 1) when bridging develops within the reaction chamber 16. In accordance with certain examples, the silicon-containing precoat 206 may have a thickness that is between about 1 micron and about 3 microns. Advantageously, limiting thickness of the silicon-containing precoat 206 to thicknesses within these ranges can limit the tendency that the silicon-containing precoat 206 to otherwise interfere with movement of lift pins within through-holes defined within the substrate support during seating and unseating of the substrate 2.

With reference to FIG. 9, a film deposition method 300 is shown. The method 300 includes seating a substrate with a beveled edge on a ledge portion of a substrate support, e.g., seating the substrate 2 (shown in FIG. 1) on the ledge portion 112 (shown in FIG. 5) or the substrate support 100 (shown in FIG. 1), as shown with box 310. The method 300 also includes flowing a silicon-containing precursor across the substrate, e.g., the film precursor 20 (shown in FIG. 1), as shown with box 320, and depositing a film, e.g., the film 4 (shown in FIG. 1) onto the surface of the substrate using the silicon-containing precursor, as shown with box 330. It is contemplated that seating the substrate on the ledge portion of the substrate support include supporting the substrate such that the beveled edge of the substrate is cantilevered above the ledge portion of the upper surface of the substrate support, as shown with box 312. It is also contemplated that a portion of the bottom surface of the substrate radially inward of the beveled edge be cantilevered above the ledge portion of the upper surface of the substrate support, as shown with box 314.

In certain examples, flowing the silicon-containing precursor across the substrate may include flowing silane across the substrate, as shown with box 322. In accordance with certain examples, the flowing the silicon-containing precursor across the substrate may include flowing dichlorosilane (DCS) across the surface of the substrate, as shown with box 324. It is also contemplated that, in accordance with certain examples, that the flowing the silicon-containing precursor across the substrate may include flowing trichlorosilane (TCS) across the surface of the substrate, as shown with box 326.

In certain examples, depositing the film onto the substrate using the silicon-containing precursor may include depositing the film as an epitaxial layer onto the substrate, as shown with box 332. In accordance with certain examples, depositing the film onto the upper surface of the substrate may include depositing a thick epitaxial layer onto the upper surface of the substrate, as shown with box 334. For example, the epitaxial layer may be deposited with a thickness that is between about 50 microns and about 150 microns, or is between about 60 microns and about 125 microns, or is between about 70 microns and about 100 microns. The film may be deposited with a thickness that is about 85 microns.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

The invention claimed is:

1. A substrate support, comprising:

a disc body having an upper surface and an axially opposite lower surface arranged along a rotation axis, the upper surface having:

a circular concave portion extending about the rotation axis;

an annular ledge portion extending circumferentially about the circular concave portion; and an annular rim portion extending circumferentially about the annular ledge portion, the annular rim portion connected to the circular concave portion by the annular ledge portion of the disc body, wherein the annular ledge portion slopes downward in a direction radially outward from the rotation axis to seat a substrate on the disc body such that a beveled edge of the substrate is cantilevered above the annular ledge portion of the upper surface of the disc body, and wherein the upper surface has a chamfer connecting the annular ledge portion to the annular rim portion.

2. The substrate support of claim 1, wherein the annular ledge portion has a radially inward seating apex extending circumferentially about the rotation axis, and wherein the annular ledge portion slopes downward at a negative ledge angle to horizontal radially outward of the radially inward seating apex.

3. The substrate support of claim 2, wherein the negative ledge angle is between −0.2 degrees and −4 degrees, or is between −0.4 degrees and −3 degrees, or is between −0.6 degrees and −3 degrees, or is between −0.8 degrees and −2 degrees.

4. The substrate support of claim 2, wherein the radially inward seating apex is radially offset from the rotation axis by between 140 millimeters and 149 millimeters, or between 142 millimeters and 148 millimeters, or by between 144 millimeters and 146 millimeters.

5. The substrate support of claim 2, wherein the annular ledge portion slopes downward without interruption between the radially inward seating apex and the chamfer at a negative ledge angle.

6. The substrate support of claim 1, wherein the annular rim portion comprises:

a radially inner side wall extending upwards from the annular ledge portion;

an outer side wall radially outward of the radially inner side wall and extending circumferentially about the annular ledge portion; and an upper rim surface connecting the outer side wall to the radially inner side wall, the upper rim surface being substantially orthogonal relative to the rotation axis and axially offset from a seating apex of the annular ledge portion by a distance greater than a thickness of the substrate seated on the seating apex.

7. The substrate support of claim 6, wherein the radially inner side wall cooperates with the circular concave portion and the annular ledge portion of the upper surface of the disc body to define a narrow pocket for seating a substrate thereon.

8. The substrate support of claim 6, wherein the radially inner side wall is radially offset from the rotation axis by between 150.5 millimeters and 151.5 millimeters, or between 150.6 millimeters and 151 millimeters, or between 150.7 millimeters and 150.9 millimeters.

9. The substrate support of claim 1, wherein the annular ledge portion slopes downward in a direction radially inward from a seating apex defined on the annular ledge portion of the disc body.

10. The substrate support of claim 9, wherein the annular ledge portion slopes downward toward the circular concave portion of the upper surface of the disc body at greater steepness than steepness at which the circular concave portion slopes downward toward the annular rim portion of the upper surface of the disc body.

11. The substrate support of claim 9, wherein the annular ledge portion slopes downward between the seating apex and the circular concave portion by between −10 degrees and −20 degrees, or between −12 degrees and −19 degrees, or between −14 degrees and −18 degrees.

12. The substrate support of claim 1, wherein the disc body comprises:

a bulk graphite material;

a silicon carbide coating overlaying the bulk graphite material; and a silicon-containing precoat layer overlaying the silicon carbide coating, wherein the silicon-containing precoat layer has a thickness that is between about 1 micron and 3 microns.

13. The substrate support of claim 1, further comprising:

a silicon wafer with a beveled edge seated on the annular ledge portion of the disc body;

a silicon layer deposited onto a top surface of the silicon wafer; and bridging extending between a bottom surface of the annular ledge portion of the disc body, wherein the bridging is radially inward of the beveled edge of the silicon wafer.

14. The substrate support of claim 13, wherein the bridging is radially inward of the beveled edge by between 1millimeter and 10 millimeters, or by between 2 millimeters and 8 millimeters, or by between 3 millimeters and 6 millimeters.

15. The substrate support of claim 13, wherein the silicon layer has a thickness that is between 50 microns and 150 microns, or is between 60 microns and 125 microns, or is between 70 microns and 100 microns.

16. The substrate support of claim 13, wherein the annular rim portion has in inner side wall extending circumferentially about the rotation axis and upwards from the annular ledge portion, wherein the beveled edge of the substrate is radially spaced from the inner side wall by between 0.5 millimeters and 1.5 millimeters, or by between 0.6 millimeters and 1.25 millimeters, or by between 0.7 millimeters and 1 millimeter.

17. A substrate support assembly, comprising:
  a substrate support as recited in claim 1, wherein the annular ledge portion of the upper surface of the disc body has a seating apex extending circumferentially about the rotation axis, wherein the annular ledge portion slopes downward in a direction radially inward of the seating apex and toward the circular concave portion of the upper surface of the disc body;
  a seating member configured to be fixed in rotation relative to the substrate support;
  a shaft member configured to be fixed in rotation relative to the seating member;
  a divider with an aperture extending therethrough configured to receive therein the substrate support, the aperture having diameter greater than a diameter of the disc body; and
  a divider support configured to support the divider within a reaction chamber of a semiconductor processing system employed to deposit films onto substrates supported on the substrate support.

18. A substrate support, comprising:
  a disc body having an upper surface and an axially opposite lower surface arranged along a rotation axis, the upper surface having:
    a circular concave portion extending about the rotation axis;
    an annular ledge portion extending circumferentially about the circular concave portion; and
    an annular rim portion extending circumferentially about the annular ledge portion, the annular rim portion connected to the circular concave portion by the annular ledge portion of the disc body,
  wherein the annular ledge portion slopes downward in a direction radially outward from the rotation axis to seat a substrate on the disc body such that a beveled edge of the substrate is cantilevered above the annular ledge portion of the upper surface of the disc body,
  wherein the annular rim portion comprises:
    a radially inner side wall extending upwards from the annular ledge portion;
    an outer side wall radially outward of the radially inner side wall and extending circumferentially about the annular ledge portion; and
    an upper rim surface connecting the outer side wall to the radially inner side wall, the upper rim surface being substantially orthogonal relative to the rotation axis and axially offset from a seating apex of the annular ledge portion by a distance greater than a thickness of the substrate seated on the seating apex, and
  wherein the seating apex extends circumferentially about the rotation axis, and wherein the upper rim surface is between 0.8 millimeters and 2 millimeters above the seating apex, or is between 0.8 millimeters and 1 millimeter above the seating apex.

* * * * *